United States Patent
Lim

(10) Patent No.: US 7,498,878 B2
(45) Date of Patent: Mar. 3, 2009

(54) MULTI-PATH DOHERTY AMPLIFIER AND CONTROL METHOD OF A MULTI-PATH DOHERTY AMPLIFIER

(75) Inventor: Jun Youl Lim, Gunpo-si (KR)

(73) Assignee: LG-Nortel Co., Ltd., Seoul (KR)

( * ) Notice: Subject to any disclaimer, the term of this patent is extended or adjusted under 35 U.S.C. 154(b) by 35 days.

(21) Appl. No.: 11/826,956

(22) Filed: Jul. 19, 2007

(65) Prior Publication Data

US 2008/0036533 A1 Feb. 14, 2008

(30) Foreign Application Priority Data

Aug. 11, 2006 (KR) .................. 10-2006-0076309

(51) Int. Cl.
*H03F 3/68* (2006.01)
(52) U.S. Cl. .................. 330/124 R; 330/295
(58) Field of Classification Search ............. 330/124 R, 330/295, 84, 126
See application file for complete search history.

(56) References Cited

U.S. PATENT DOCUMENTS

| | | | | |
|---|---|---|---|---|
| 5,786,727 A | * | 7/1998 | Sigmon | .................. 330/124 R |
| 6,853,245 B2 | * | 2/2005 | Kim et al. | ................ 330/124 R |
| 7,427,895 B1 | * | 9/2008 | Okubo et al. | ........... 330/124 R |
| 2003/0141933 A1 | | 7/2003 | Pengelly | |
| 2005/0272382 A1 | | 12/2005 | Amano | |
| 2006/0097783 A1 | | 5/2006 | Okubo et al. | |
| 2006/0246855 A1 | | 11/2006 | Kato et al. | |

OTHER PUBLICATIONS

European Search Report dated Jan. 8, 2008.

* cited by examiner

*Primary Examiner*—Henry K Choe
(74) *Attorney, Agent, or Firm*—Ked & Associates, LLP

(57) ABSTRACT

Embodiments of the present invention may provide a Doherty amplifier that includes a first amplifying path and at least one second amplifying path. The first amplifying path may include a carrier amplifier to amplify an input signal in a Class 1 mode. The second amplifying path may include a supplementary input matching circuit to input-match the input signal, a phase shifter to phase-shift an output from the supplementary input matching circuit, and a peak amplifier to amplify an output from the phase shifter in a Class 2 mode. The second amplifying path may further include a supplementary output matching circuit to output-match an output from the peak amplifier. The second amplifying path may provide an equivalent amplified output equivalent to the first amplifying path by cooperation of the supplementary input matching circuit and the supplementary output matching circuit.

19 Claims, 10 Drawing Sheets

MULTI-PATH DOHERTY AMPLIFIER AND CONTROL METHOD OF A MULTI-PATH DOHERTY AMPLIFIER

The present application claims priority from Korean Patent Application No. 10-2006-0076309, filed Aug. 11, 2006, the entire subject matter of which is incorporated herein by reference.

BACKGROUND

1. Field

Embodiments of the present invention may relate to a multi-path Doherty amplifier. More particularly embodiments of the present invention may relate to a Doherty amplifier where each peak amplifier may have optimal (or near optimal) output and efficiency characteristics even when the Doherty amplifier operates as a multi-path amplifier.

2. Background

Power amplifiers used in a mobile communication terminal and/or a mobile communication system based on Code Division Multiple Access (CDMA) may need high linearity and high efficiency characteristics. In particular, when the power amplifier has high efficiency characteristics, a battery time may increase whereas heat generation may decrease. Thus, efficiency of power amplifiers may be a very important factor in manufacturing mobile communication terminals. A Doherty amplifier is one type of high efficiency amplifier. The Doherty amplifier may be considered as a power amplifier for mobile communication systems.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1A:
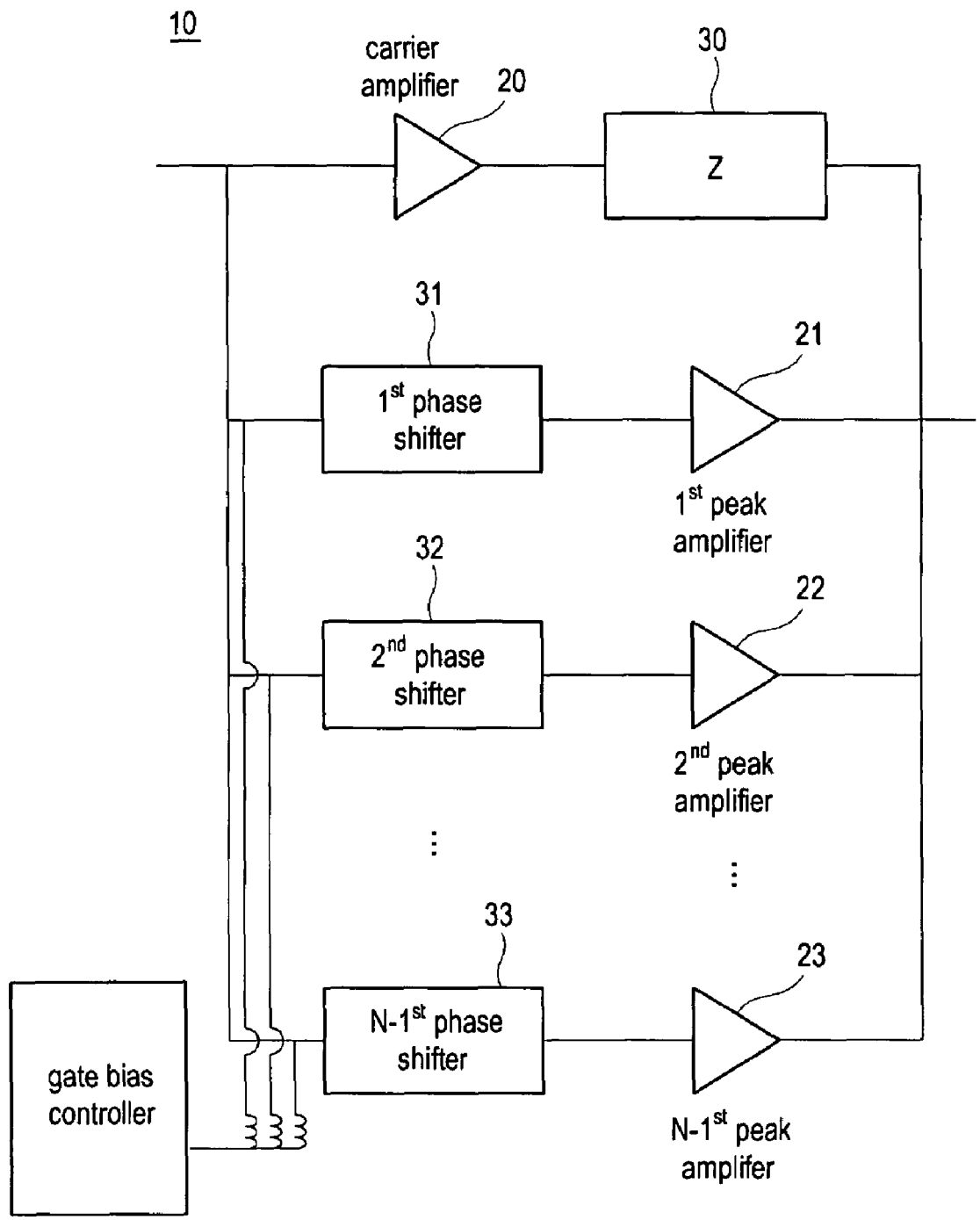
FIG. 1A illustrates a Doherty amplifier accordance to an example arrangement.

The Doherty amplifier is one type of amplifier used for a high efficiency modulation scheme in a high power transmitter. The Doherty amplifier may enhance efficiencies by connecting a carrier amplifier and a peak amplifier in parallel. FIG. 1A shows a Doherty amplifier 10 where one carrier amplifier 20 and a plurality of peak amplifiers 21, 22, . . . , 23 are connected in parallel. This type of Doherty amplifier may enhance power efficiency.

Doherty operations performed in the Doherty amplifier 10 will now be explained with reference to FIG. 1A. When power is input to the Doherty amplifier 10, the initial input power may be low. Thus, only the carrier amplifier 20 operating in a Class B mode or a Class AB mode may be operated. As the input power increases, however, the carrier amplifier 20 may become saturated and the peak amplifiers 21-23 operating in a Class C mode may then be operated. A load line impedance 30 of the carrier amplifier 20 may be modulated accordingly. That is, the load line impedance 30 may decrease until a same power is transferred from the carrier amplifier 20 and each of the peak amplifiers 21-23.

FIG. 1A also shows a gate bias controller 40 that may control 1st to N-1st phase shifters 31, 32, . . . , 33 so that a phase of the signals input to the 1st to N-1st peak amplifiers 21-23 may be respectively compensated by as much as a phase of the output signal of the carrier amplifier 20 that is shifted by the load line impedance 30. Accordingly, an output signal from the 1st to N-1st peak amplifiers 21-23 and an output signal from the load line impedance 30 may acquire a same phase.

As such, FIG. 1A shows an example arrangement in which additional output power can be provided as compared to a case where a signal is amplified by only one amplifier. This is because a same power may be provided from the carrier amplifier 20 and the peak amplifiers 21-23. Further, the amplification may be performed at a broader range of power level as compared to a case where only the carrier amplifier is provided. This may be because the carrier amplifier is prone to being saturated even at a low power level.

However, since the Doherty amplifier has only one input/output port, the Doherty amplifier may be installed with as many antennas as is needed to support state of the art technologies, such as Smart Antenna and multiple-in-multiple-out (MIMO), which use a plurality of antennas. For this reason, the Doherty amplifier may not be cost-effective. Further, since the multi-antenna technology, such as Smart Antenna or MIMO, can provide a higher antenna gain as compared to a single antenna by using a small multi antenna output, power inevitably may be wasted if a multi antenna structure (Smart Antenna, MIMO, etc.) is supported by a plurality of single power amplifiers. For example, a structure having N number of Smart Antennas may show a same performance as a single antenna, which has N×N times of output power. Accordingly, a multi-path Doherty amplifier 100 as shown in FIG. 1B may be provided.

Figure 1B:
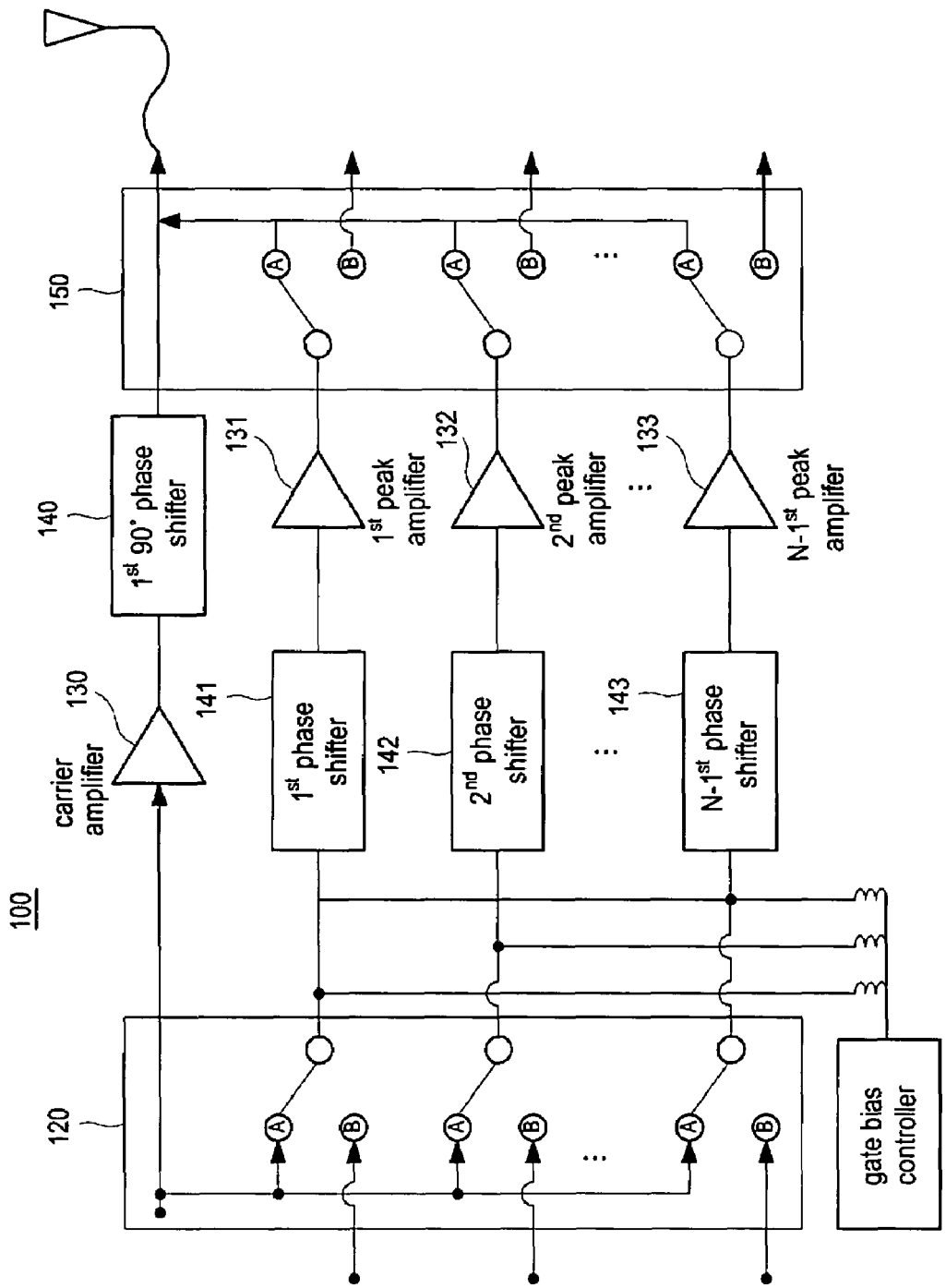
FIG. 1B illustrates a multi-path Doherty amplifier according to an example arrangement.

The multi-path Doherty amplifier 100 shown in FIG. 1B includes a multi-input switch part 120 and a multi-output switch part 150 along with components of the Doherty amplifier 10 shown in FIG. 1A. Based on a switching scheme of the multi-input switch part 120 and the multi-output switch part 150, the multi-path Doherty amplifier 100 may operate in a single-path mode (if all the switches are switched to A points) or a multi-path mode (if all the switches are switched to B points).

If the Doherty amplifier 100 operates as a single-path amplifier (or in a single-path mode), then the amplifier 100 may perform a Doherty operation similar to the Doherty amplifier 10 shown in FIG. 1A. However, if the Doherty amplifier 100 operates as a multi-path amplifier (or in a multi-path mode), then the carrier amplifier 130 and peak amplifiers 131-133 may operate as separate power amplifiers, which may cause problems.

As explained above, the carrier amplifier 130 may operate as a Class AB or a Class B amplifier, whereas the peak amplifiers 131-133 may operate as Class C amplifiers. When the carrier amplifier 130 and the peak amplifiers 131-133 operate as separate power amplifiers, the carrier amplifier 130 may perform amplification at a low power level since the carrier amplifier 130 operates as the Class AB or Class B amplifier. Since the peak amplifiers 131-133 are still configured to operate as the Class C amplifier, however, the peak amplifiers 131-133 may not operate as the Class AB or Class B amplifier at the low power level. This may cause output power loss and efficiency problem.

To compensate for the output power loss, elements with higher output power may be used. However, this may increase manufacturing costs of a power amplifier. Further, efficiency problems may have negative effects upon battery time, life time of mobile communication terminals and system stability due to generation of intensive heat.

Figure 2A:
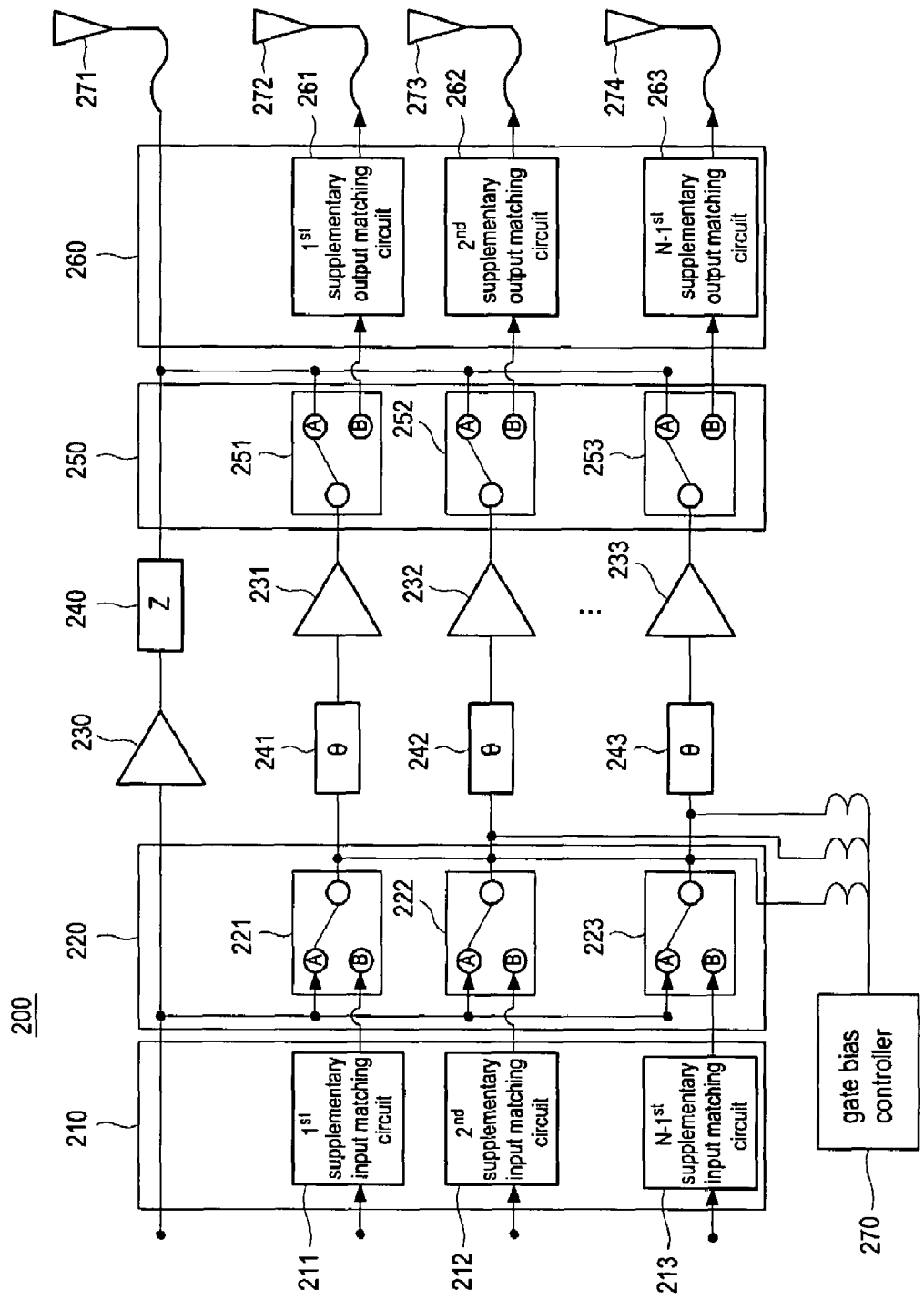
FIG. 2A illustrates a multi-path Doherty amplifier operating as a single-path amplifier in accordance with an example embodiment of the present invention.

FIG. 2A illustrates a multi-path Doherty amplifier operating as a single-path amplifier in accordance with an example embodiment of the present invention. Other embodiments and configurations are also within the scope of the present invention. More specifically, as shown in FIG. 2A, a multi-path Doherty amplifier 200 may include a supplementary input matching circuit part 210 having 1st to N-$1^{st}$ supplementary input matching circuits 211-213, a multi-input switch part 220 having 1st to N-$1^{st}$ input switches 221-223, a carrier amplifier 230, 1st to N-$1^{st}$ peak amplifiers 231-233, a load line impedance 240, 1st to N-$1^{st}$ phase shifters 241-243, a multi-output switch part 250 having $1^{st}$ to N-$1^{st}$ output switches 251-253, a supplementary output matching circuit part 260 having $1^{st}$ to N-$1^{st}$ supplementary output matching circuits 261-263, and a gate bias controller 270.

The carrier amplifier 230 may operate as a Class AB amplifier or a Class B amplifier. Further, the $1^{st}$ to N-$1^{st}$ peak amplifiers 231-233 may operate as Class C amplifiers. For ease of description, the following description may relate to the carrier amplifier 230 operating as a Class AB amplifier and the $1^{st}$ to N-$1^{st}$ peak amplifiers 231-233 operating as Class C amplifiers.

As shown in FIG. 2A, if all the switches in the multi-input switch part 220 and the multi-output switch part 250 ate switched to A points (such as in a single path mode), then a signal is inputted/outputted through a single-path of the Doherty amplifier 200.

Figure 2B:
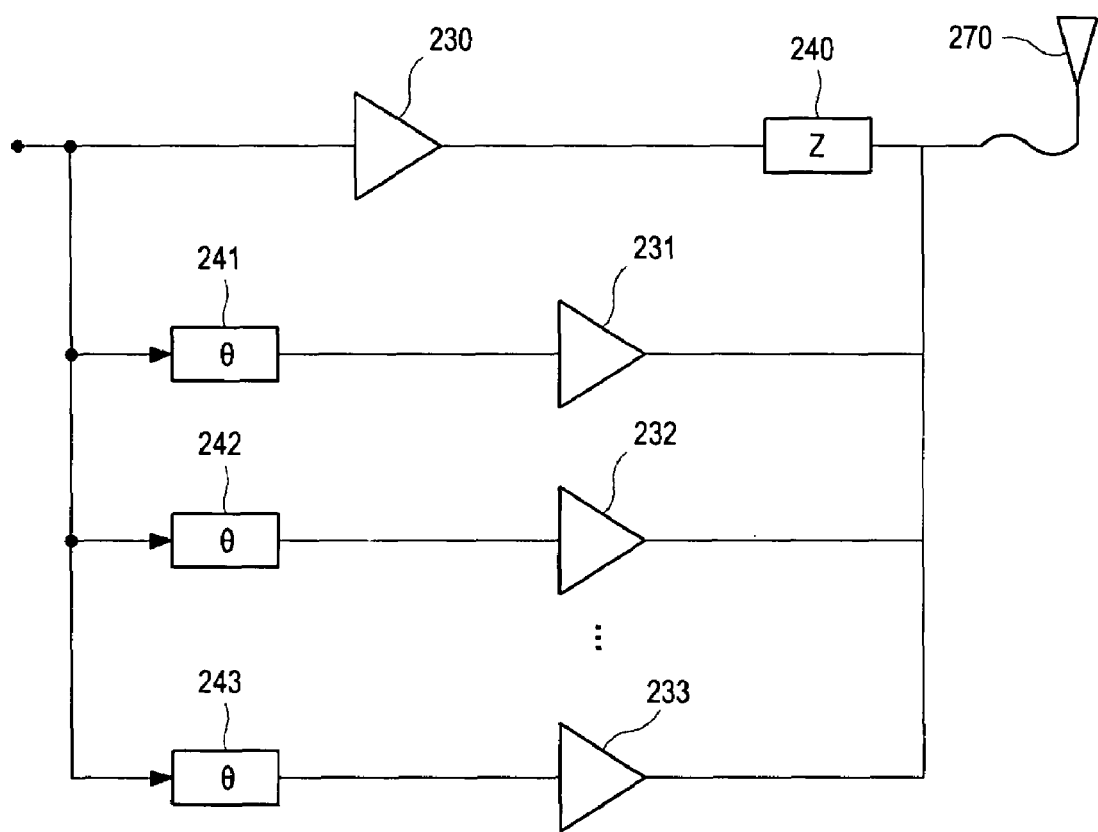
FIG. 2B is a diagram showing operation of the Doherty amplifier shown in FIG. 2A in accordance with an example embodiment of the present invention.

FIG. 2B is a diagram showing the Doherty amplifier operating as a single-path amplifier (such as in a single path mode) in accordance with an example embodiment of the present invention. As shown in FIG. 2B, if the Doherty amplifier 200 operates as a single-path amplifier, then operation of the amplifier 200 may be identical (or similar) to operation of the Doherty amplifier 10 shown in FIG. 1A. Since the constitution and operation of the Doherty amplifier 10 shown in FIG. 1A has been described above, a further explanation regarding the Doherty amplifier 200 shown in FIG. 2A will be omitted.

Figure 3A:
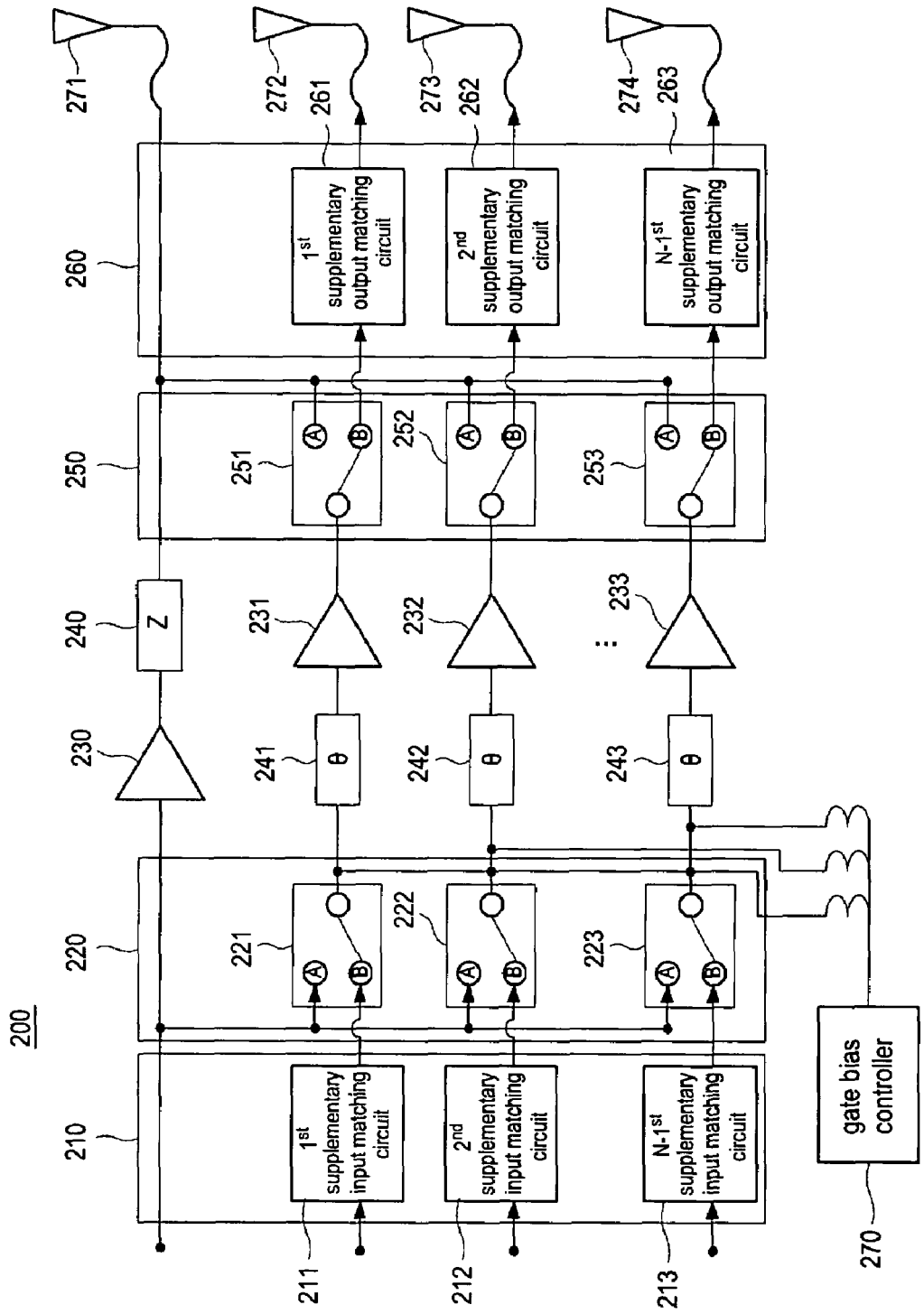
FIG. 3A illustrates the Doherty amplifier shown in FIG. 2 operating as a multiple-path amplifier in accordance with an example embodiment of the present invention.
Figure 3B:
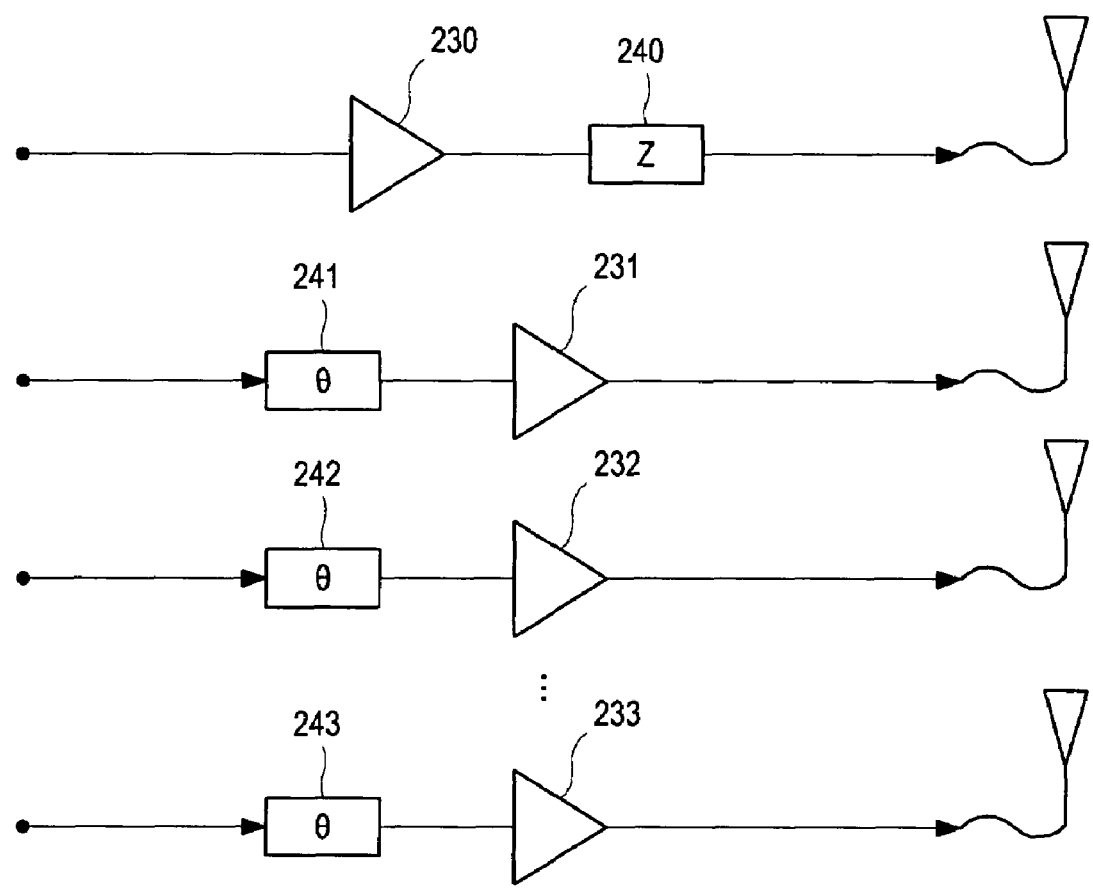
FIG. 3B is a diagram showing operation of the Doherty amplifier shown in FIG. 3A in accordance with an example embodiment of the present invention.

FIG. 3A illustrates the Doherty amplifier 300 shown in FIG. 2 operating as a multiple-path amplifier (such as in a multi-path mode) in accordance with an example embodiment of the present invention. Other embodiments and configurations are also within the scope of the present invention. As shown in FIG. 3A, all the switches in the multi-input switch part 220 and the multi-output switch part 250 are switched to B points, wherein each signal may be inputted/outputted through a separate path. Thus, each of the carrier amplifiers 230 and the $1^{st}$ to N-$1^{st}$ peak amplifiers 231-233 may operate as separate amplifiers. FIG. 3B is a diagram showing the Doherty amplifier 200 shown in FIG. 3A operating as a multiple-path amplifier in accordance with an example embodiment of the present invention. Other embodiments and configurations are also within the scope of the present invention.

Figure 4:
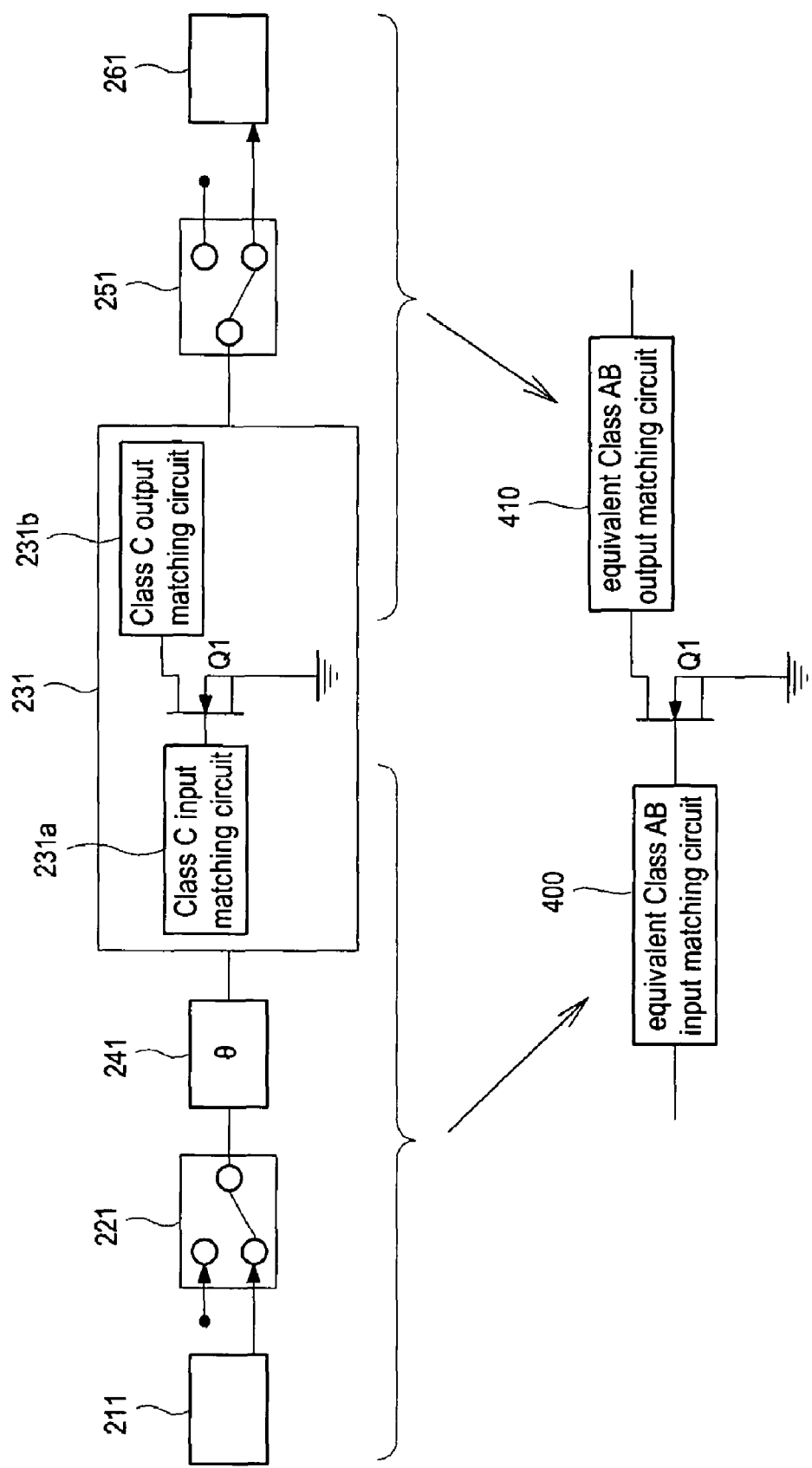
FIG. 4 is a circuit diagram of a 1st peak amplifier operating as a separate amplifier and an equivalent circuit thereof in accordance with an example embodiment of the present invention.

FIG. 4 is a circuit diagram of a 1st peak amplifier operating as a separate amplifier and an equivalent circuit thereof in accordance with an example embodiment of the present invention. Other embodiments and configurations are also within the scope of the present invention. As shown in an upper part of FIG. 4, the 1st peak amplifier 231 may include a Class C input matching circuit 231a and a Class C output matching circuit 231b.

The $1^{st}$ supplementary input matching circuit 211, the $1^{st}$ input switch 211, the $1^{st}$ phase shifter 241 and the Class C input matching circuit 231a may operate as an equivalent Class AB input matching circuit 400 as shown in the equivalent circuit in a lower part of FIG. 4. Also, the Class C output matching circuit 231b, the $1^{st}$ output switch 251 and the $1^{st}$ supplementary matching circuit 261 may operate as an equivalent Class AB output matching circuit 410. Accordingly, the $1^{st}$ peak amplifier 231 may operate as a Class AB amplifier by including the Class AB input matching circuit 400 and the Class AB output matching circuit 410. Since the $2^{nd}$ to N-$1^{st}$ peak amplifiers 232 and 233 may also operate as described above, each of the $1^{st}$ to N-$1^{st}$ peak amplifiers 230-231 may operate as separate Class AB amplifiers. Therefore, each amplifier operating separately as shown in FIG. 3B may have optimal output power and efficiency.

Figure 5:
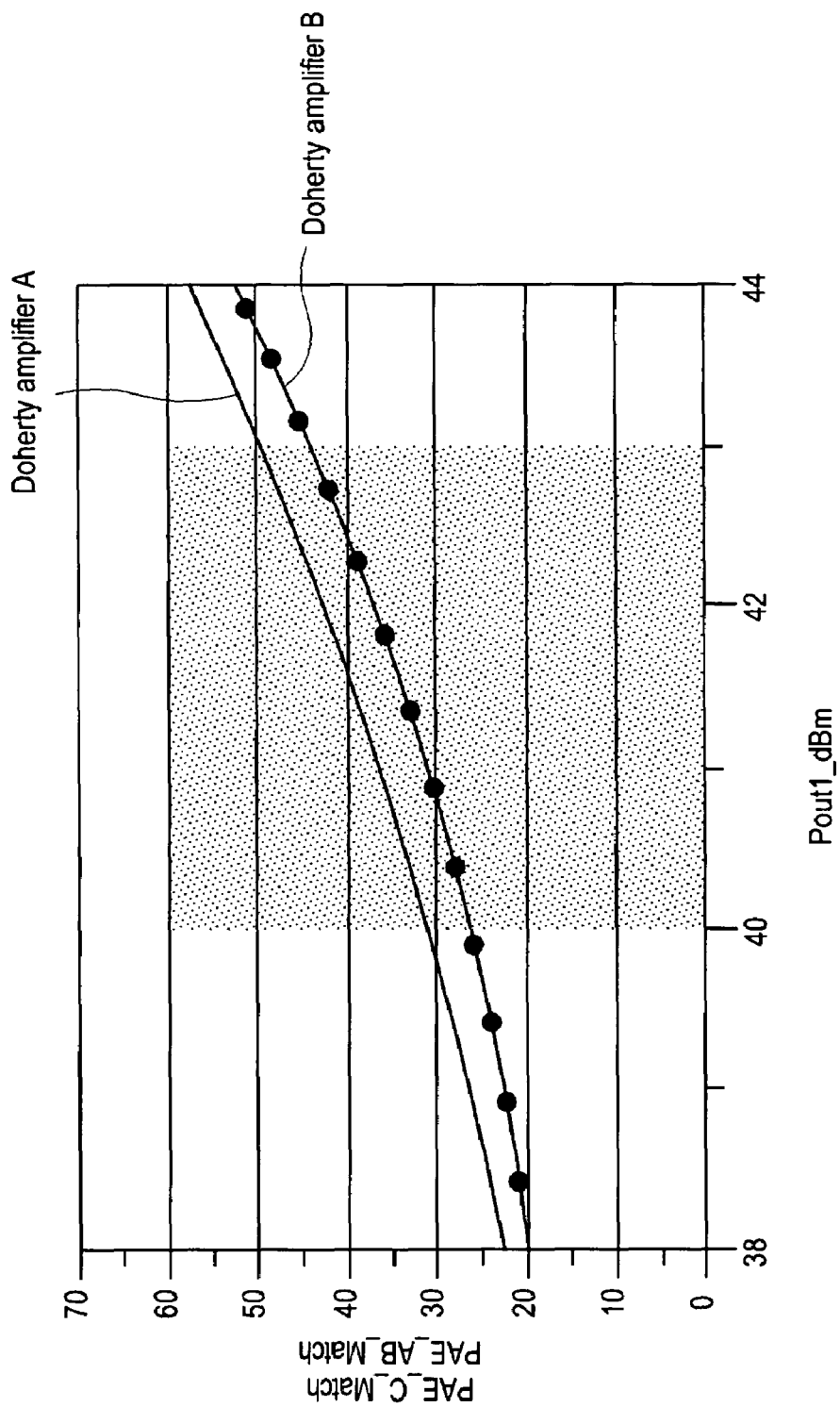
FIG. 5 is a graph showing output power efficiencies of a power amplifier according to an example embodiment of the present invention as well as an example arrangement.

FIG. 5 is a graph showing output power efficiencies of a power amplifier according to an example embodiment of the present invention as well as an example arrangement. In this figure, Doherty amplifier A corresponds to an example embodiment of the present invention and Doherty amplifier B corresponds to an example arrangement. The graph shows that power efficiency of an example embodiment of the present invention in a shaded portion of FIG. 5 where the peak amplifiers may operate (i.e., 40 dBm to 43 dBm) is higher than power efficiency of the peak amplifier having a example matching circuit by 5 to 6%.

The following Table 1 compares efficiencies of the power amplifier according to an example embodiment of the present invention as well as an example arrangement when output power is 43 dBm.

TABLE 1

| | Matching Circuit Requirement | Input Matching Value | Output Matching Value | Output Power | Power Efficiency |
|---|---|---|---|---|---|
| Example Arrangement of Power Amplifier | Class C | 29.3-j24.2 | 8.6-j2.5 | 43 dBm | 44% |
| Power Amplifier of Example Embodiment of the Present Invention | Class AB | 25.9-j6 | 12.7-j5.4 | 43 dBm | 50% |

As shown above, when the multi-path Doherty amplifier 200 operates not only as a single path amplifier but also as a multi-path amplifier, the 1st to N-1st peak amplifiers 231-233 may also operate as Class AB amplifiers. Therefore, optimal (or near optimal) output power and efficiency can be obtained.

Referring back to FIGS. 3A and 3B, the signals from the supplementary output matching circuit part 260 may be transmitted by the antennas 271-274 coupled to the respective output ports of the Doherty amplifier 200. The signals may be transmitted by all or part of the antennas 271-274 based on a switching scheme of the multi-input switch part 220 and the multi-output switch part 250.

Figure 6:
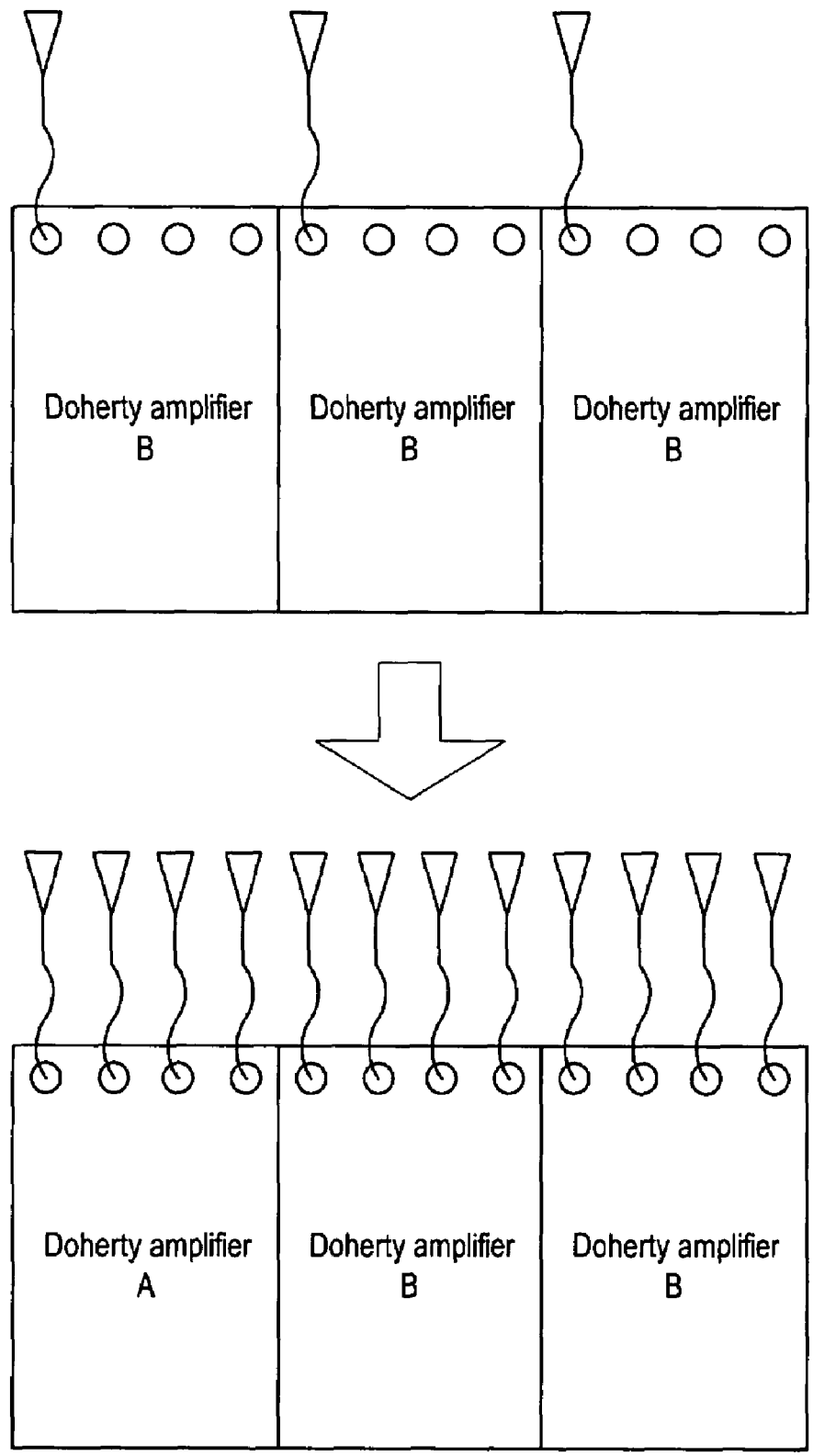
FIG. 6 illustrates a 3-sector base station supporting 4-way smart antennas in accordance with an example embodiment of the present invention.

FIG. 6 illustrates a 3-sector base station that supports 4-way Smart Antennas in accordance with an example embodiment of the present invention. Other embodiments and configurations are also within the scope of the present invention. In this figure, Doherty amplifier A corresponds to an example embodiment of the present invention and Doherty amplifier B corresponds to an example arrangement. As shown in an upper part of FIG. 6, embodiments of the present invention may not require an additional module, whereas other example arrangements of the amplifier may require an additional module in order to increase output power. For this reason, embodiments of the present invention may be cost-effective.

Figure 7:
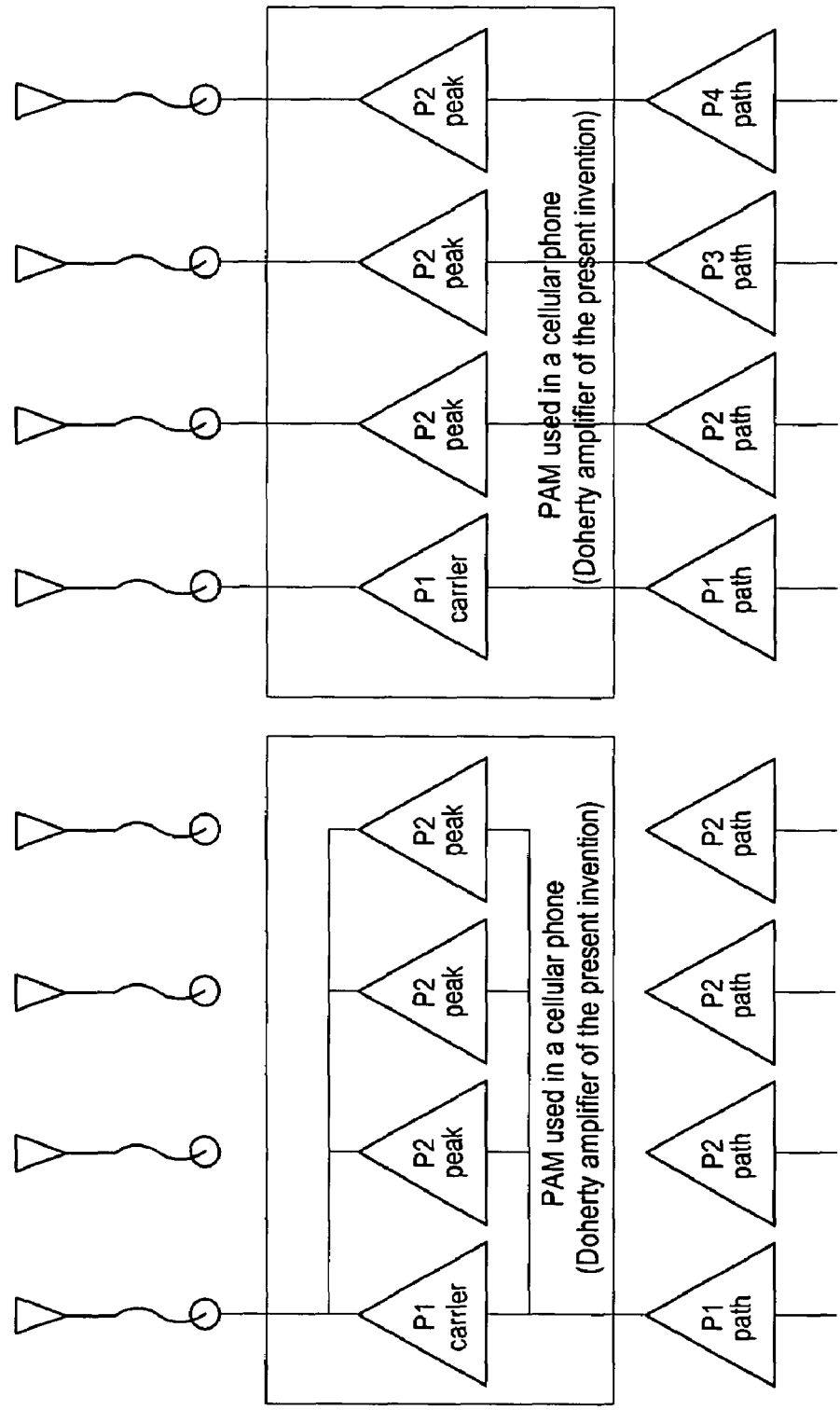
FIG. 7 illustrates a mobile station supporting 4-way smart antennas in accordance with an example embodiment of the present invention.

FIG. 7 illustrates a mobile communication terminal that supports 4-way Smart Antennas in accordance with an example embodiment of the present invention. Other embodiments and configurations are also within the scope of the present invention. When mobile communication terminal is within a boundary of a base station that supports a Smart Antenna, the Doherty amplifier of embodiments of the present invention may operate as shown in the right portion of FIG. 7. However, when the mobile communication terminal is within a boundary of a base station that does not support a Smart Antenna, the Doherty amplifier of embodiments of the present invention may operate as shown in the left portion of FIG. 7. Therefore, the Doherty amplifier may have optimal (or near optimal) output power and efficiency.

As discussed above, the multi-path Doherty amplifier according to example embodiments may operate as an optimal Class amplifier by an input supplementary matching circuit and an output supplementary matching circuit to thereby obtain optimal (or near optimal) output power and efficiency characteristics.

Any reference in this specification to "one embodiment," "an embodiment," "example embodiment," etc., means that a particular feature, structure or characteristic described in connection with the embodiment is included in at least one embodiment of the present invention. The appearances of such phrases in various places in the specification are not necessarily all referring to the same embodiment. Further, when a particular feature, structure or characteristic is described in connection with any embodiment, it is submitted that it is within the purview of one skilled in the art to effect such feature, structure or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A Doherty amplifier, comprising:
   a first amplifying path that includes a carrier amplifier to amplify an input signal in a Class 1 mode; and
   at least one second amplifying path that includes:
      a supplementary input matching circuit to input-match another input signal;
      a phase shifter to phase-shift an output of the supplementary input matching circuit;
      a peak amplifier to amplify an output of the phase shifter in a Class 2 mode; and
      a supplementary output matching circuit to output-match an output of the peak amplifier,
   wherein the at least one second amplifying path provides an amplified output equivalent to the first amplifying path by cooperation of the supplementary input matching circuit and the supplementary output matching circuit.

2. The Doherty amplifier of claim 1, wherein the first amplifying path further includes load line impedance to phase-shift the signal amplified by the carrier amplifier in the Class 1 mode.

3. The Doherty amplifier of claim 2, further comprising a gate bias controller to control the phase shifter such that an output phase from the at least one second amplifying path is matched with an output phase from the first amplifying path.

4. The Doherty amplifier of claim 3, wherein the at least one second amplifying path further includes:
   a multi-input switch to output either an output of the supplementary input matching circuit or the input signal; and
   a multi-output switch to switch the signal amplified in the Class 2 mode to the first amplifying path or the second amplifying path, wherein the signal switched to the first amplifying path is common-coupled to an output of the load line impedance.

5. The Doherty amplifier of claim 4, wherein the multi-input switch and the multi-output switch are switched such that the Doherty amplifier operates as a multi-path amplifier when a mobile communication terminal is within a boundary of a base station supporting a 4-way Smart Antenna.

6. The Doherty amplifier of claim 4, wherein the multi-input switch and the multi-output switch are switched such that the Doherty amplifier operates as a single-path amplifier when a mobile communication terminal is within a boundary of a base station not supporting a 4-way Smart Antenna.

7. The Doherty amplifier of claim 4, further comprising a plurality of antennas to output respective output signals of the first amplifying path and the at least one second amplifying path.

8. The Doherty amplifier of claim 1, wherein the Class 1 mode includes Class AB or Class B, and the Class 2 mode includes Class C.

9. A Doherty amplifier, comprising:
   a first amplifying path and a plurality of second amplifying paths, wherein said first amplifying path includes:
      a carrier amplifier coupled to an input line to amplify an input signal in a Class 1 mode; and
      a load line impedance to phase-shift the signal amplified by the carrier amplifier in the Class 1 mode, and
   wherein said plurality of second amplifying paths includes:
      a plurality of supplementary input matching circuits each coupled to other input lines to input-match other input signals provided on the other input lines;

a plurality of multi-input switches to respectively provide either an output of the respective supplementary input matching circuit or the input signal;

a plurality of phase shifters to phase-shift outputs of the respective multi-input switches;

a plurality of peak amplifiers to amplify outputs of the respective phase shifters in a Class 2 mode;

a plurality of multi-output switches to switch the respective signals amplified in the Class 2 mode to the first amplifying path or to respective ones of the second amplifying paths, wherein the signals switched to the first amplifying path are commonly-coupled to an output of the load line impedance; and a plurality of supplementary output matching circuits to output-match each of the signals switched to respective ones of the second amplifying paths, and wherein an input matching operation of the plurality of supplementary input matching circuits and an output matching operation of the plurality of supplementary output matching circuits are performed such that output characteristics of the second amplifying paths are substantially equivalent to output characteristics of the first amplifying path.

10. The Doherty amplifier of claim 9, further comprising a gate bias controller to control the plurality of phase shifters such that phases of signals amplified in the Class 2 mode are matched with a phase of a signal amplified in the Class 1 mode.

11. The Doherty amplifier of claim 9, further comprising a plurality of antennas to output respective output signals of the first amplifying path and the second amplifying paths.

12. The Doherty amplifier of claim 9, wherein the Class 1 mode includes Class AB or Class B, and the Class 2 mode includes Class C.

13. The Doherty amplifier of claim 9, wherein the multi-input switch and the multi-output switch are switched such that the Doherty amplifier operates as a multi-path amplifier when a mobile communication terminal is within a boundary of a base station supporting a 4-way Smart Antenna.

14. The Doherty amplifier of claim 9, wherein the multi-input switches and the multi-output switches are switched such that the Doherty amplifier operates as a single-path amplifier when a mobile communication terminal is within a boundary of a base station not supporting a 4-way Smart Antenna.

15. A control method of a Doherty amplifier comprising:
amplifying a first input signal in a Class 1 mode;
input matching a second input signal;
phase-shifting the input matched second input signal;
amplifying the phase-shifted second input signal in a Class 2 mode; and
output matching the amplified second input signal, wherein the output matched second input signal of the Doherty amplifier is equivalent to an output of the amplified first input signal of the Doherty amplifier.

16. The control method of claim 15, further comprising phase-shifting the amplified first input signal.

17. The control method of claim 15, further comprising controlling the phase shifting such that an output phase from the output matched second input signal is matched with an output phase from the first input signal.

18. The control method of claim 15, further comprising:
operating a switch to output either the first input signal or the input matched second input signal; and
operating another switch to switch the signal amplified in the Class 2 mode to one of two paths.

19. The control method of claim 15, wherein the Class 1 mode includes Class AB or Class B, and the Class 2 mode includes Class C.

* * * * *